(12) United States Patent
Wu et al.

(10) Patent No.: US 10,903,938 B2
(45) Date of Patent: Jan. 26, 2021

(54) TECHNIQUES OF ADDITIONAL BIT FREEZING FOR POLAR CODES WITH RATE MATCHING

(71) Applicant: Mediatek Inc., Hsin-Chu (TW)

(72) Inventors: Wei-De Wu, Hsinchu (TW); Chia-Wei Tai, Hsinchu (TW)

(73) Assignee: MEDIATEK INC., Hsin-Chu (TW)

( * ) Notice: Subject to any disclaimer, the term of this patent is extended or adjusted under 35 U.S.C. 154(b) by 113 days.

(21) Appl. No.: 16/105,022

(22) Filed: Aug. 20, 2018

(65) Prior Publication Data

US 2019/0058548 A1 Feb. 21, 2019

Related U.S. Application Data

(60) Provisional application No. 62/550,780, filed on Aug. 28, 2017, provisional application No. 62/547,920, filed on Aug. 21, 2017.

(51) Int. Cl.
*H04L 1/00* (2006.01)
*H03M 13/15* (2006.01)
(Continued)

(52) U.S. Cl.
CPC .......... *H04L 1/0058* (2013.01); *H04L 1/0041* (2013.01); *H04L 1/0057* (2013.01); *H04L 1/0067* (2013.01); *H04L 1/0071* (2013.01); *H03M 13/1102* (2013.01); *H03M 13/1108* (2013.01); *H03M 13/1125* (2013.01); *H03M 13/13* (2013.01); *H03M 13/151* (2013.01);
(Continued)

(58) Field of Classification Search
CPC ............. H03M 13/13; H03M 13/2906; H03M 13/1102; H03M 13/6356; H03M 13/1108; H03M 13/1125; H03M 13/6393; H03M 13/151; H03M 13/1575; H03M 13/45; H03M 13/451; H03M 13/458; H03M 13/3738; H04L 1/0057; H04L 1/0013; H04L 1/0067; H04L 1/0053; H04L 1/0058
See application file for complete search history.

(56) References Cited

U.S. PATENT DOCUMENTS

2005/0045717 A1* 3/2005 Rager .................... G06F 8/656
235/383
2015/0333769 A1 11/2015 Jeong et al.
(Continued)

FOREIGN PATENT DOCUMENTS

CN 104219019 A 12/2014

OTHER PUBLICATIONS

International Search Report of PCT/CN2018/101542, Nov. 23, 2018.

*Primary Examiner* — April Y Blair
*Assistant Examiner* — Sazzad Hossain
(74) *Attorney, Agent, or Firm* — Locke Lord LLP; Tim Tingkang Xia, Esq.

(57) ABSTRACT

In an aspect of the disclosure, a method, a computer-readable medium, and wireless equipment are provided. The wireless equipment obtains an integer E and an integer N. E encoded bits are to be selected for transmission from N encoded bits output from an encoder. The wireless equipment determines F inputs from N inputs of the encoder based on E and N. The F inputs do not include S inputs that correspond to S outputs of the encoder generating encoded bits not to be transmitted. The wireless equipment sets the F inputs to a predetermined value.

20 Claims, 12 Drawing Sheets

(51) Int. Cl.
    *H03M 13/45*     (2006.01)
    *H03M 13/29*     (2006.01)
    *H03M 13/00*     (2006.01)
    *H03M 13/11*     (2006.01)
    *H03M 13/37*     (2006.01)
    *H03M 13/13*     (2006.01)

(52) U.S. Cl.
    CPC .... *H03M 13/1575* (2013.01); *H03M 13/2906* (2013.01); *H03M 13/3738* (2013.01); *H03M 13/45* (2013.01); *H03M 13/451* (2013.01); *H03M 13/458* (2013.01); *H03M 13/6356* (2013.01); *H03M 13/6393* (2013.01); *H04L 1/0013* (2013.01); *H04L 1/0053* (2013.01)

(56) References Cited

U.S. PATENT DOCUMENTS

2016/0380763 A1    12/2016    Ahn et al.
2017/0155405 A1    6/2017    Ge et al.
2017/0222754 A1    8/2017    Moh et al.
2019/0349141 A1*    11/2019    Ahn .................... H04L 1/1812

* cited by examiner

TECHNIQUES OF ADDITIONAL BIT FREEZING FOR POLAR CODES WITH RATE MATCHING

CROSS-REFERENCE TO RELATED APPLICATION(S)

This application claims the benefit of U.S. Provisional Application Ser. No. 62/547,920, entitled "FROZEN BIT ADJUSTMENT FOR POLAR RATE-MATCHING" and filed on Aug. 21, 2017, U.S. Provisional Application Ser. No. 62/550,780, entitled "POLAR CODE RATE MATCHING DESIGN" and filed on Aug. 28, 2017, which are expressly incorporated by reference herein in their entirety.

BACKGROUND

Field

The present disclosure relates generally to communication systems, and more particularly, to techniques of channel bit interleaving of polar coded bits.

Background

The statements in this section merely provide background information related to the present disclosure and may not constitute prior art.

Wireless communication systems are widely deployed to provide various telecommunication services such as telephony, video, data, messaging, and broadcasts. Typical wireless communication systems may employ multiple-access technologies capable of supporting communication with multiple users by sharing available system resources. Examples of such multiple-access technologies include code division multiple access (CDMA) systems, time division multiple access (TDMA) systems, frequency division multiple access (FDMA) systems, orthogonal frequency division multiple access (OFDMA) systems, single-carrier frequency division multiple access (SC-FDMA) systems, and time division synchronous code division multiple access (TD-SCDMA) systems.

These multiple access technologies have been adopted in various telecommunication standards to provide a common protocol that enables different wireless devices to communicate on a municipal, national, regional, and even global level. An example telecommunication standard is 5G New Radio (NR). 5G NR is part of a continuous mobile broadband evolution promulgated by Third Generation Partnership Project (3GPP) to meet new requirements associated with latency, reliability, security, scalability (e.g., with Internet of Things (IoT)), and other requirements. Some aspects of 5G NR may be based on the 4G Long Term Evolution (LTE) standard. There exists a need for further improvements in 5G NR technology. These improvements may also be applicable to other multi-access technologies and the telecommunication standards that employ these technologies.

SUMMARY

The following presents a simplified summary of one or more aspects in order to provide a basic understanding of such aspects. This summary is not an extensive overview of all contemplated aspects, and is intended to neither identify key or critical elements of all aspects nor delineate the scope of any or all aspects. Its sole purpose is to present some concepts of one or more aspects in a simplified form as a prelude to the more detailed description that is presented later.

In an aspect of the disclosure, a method, a computer-readable medium, and wireless equipment are provided. The wireless equipment obtains an integer E and an integer N. E encoded bits are to be selected for transmission from N encoded bits output from an encoder. The wireless equipment determines F inputs from N inputs of the encoder based on E and N. The F inputs do not include S inputs that correspond to S outputs of the encoder generating encoded bits not to be transmitted. The wireless equipment sets the F inputs to a predetermined value.

To the accomplishment of the foregoing and related ends, the one or more aspects comprise the features hereinafter fully described and particularly pointed out in the claims. The following description and the annexed drawings set forth in detail certain illustrative features of the one or more aspects. These features are indicative, however, of but a few of the various ways in which the principles of various aspects may be employed, and this description is intended to include all such aspects and their equivalents.

DETAILED DESCRIPTION

Figure 1:
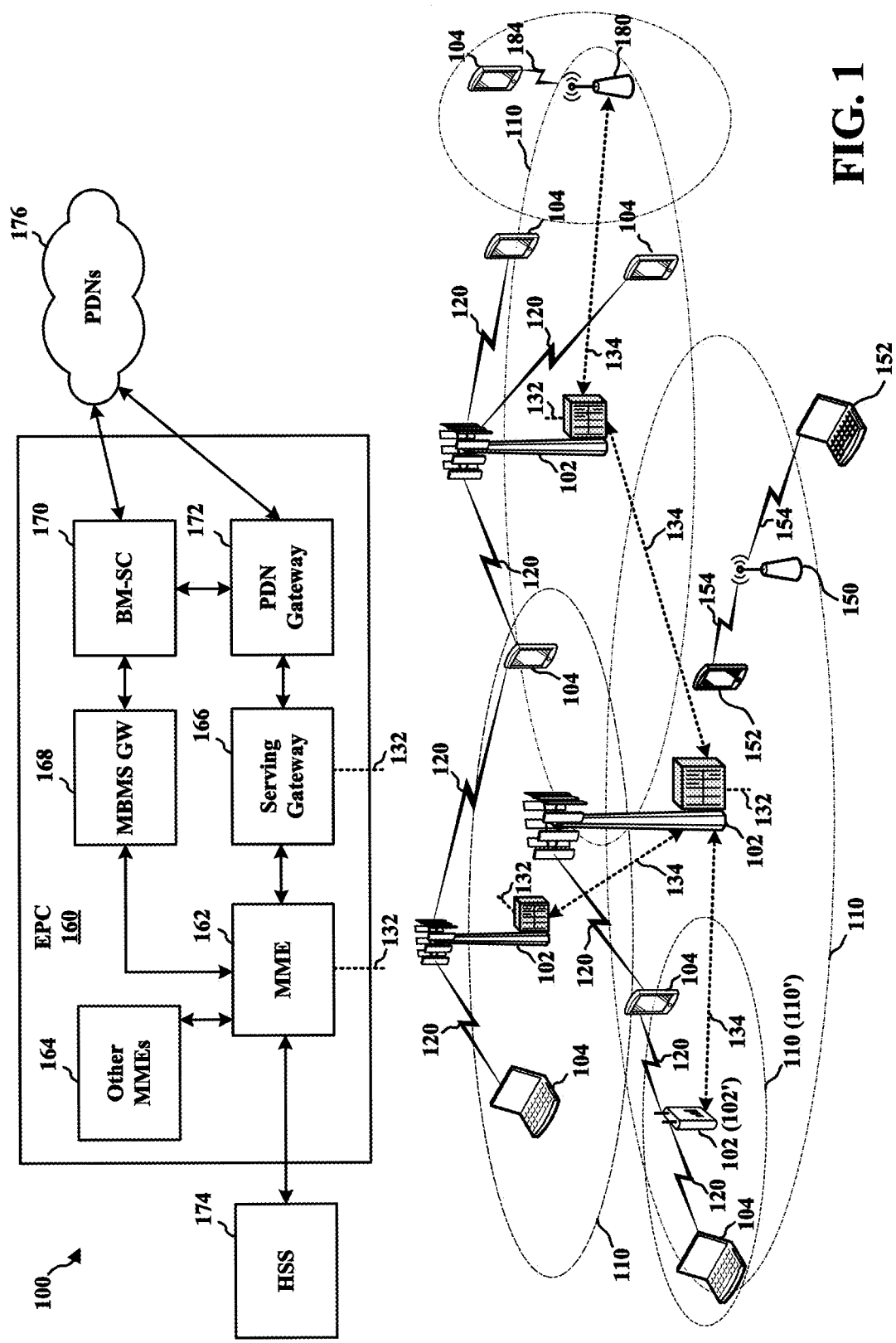
FIG. 1 is a diagram illustrating an example of a wireless communications system and an access network.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts.

Several aspects of telecommunication systems will now be presented with reference to various apparatus and methods. These apparatus and methods will be described in the following detailed description and illustrated in the accompanying drawings by various blocks, components, circuits, processes, algorithms, etc. (collectively referred to as "elements"). These elements may be implemented using electronic hardware, computer software, or any combination thereof. Whether such elements are implemented as hardware or software depends upon the particular application and design constraints imposed on the overall system.

By way of example, an element, or any portion of an element, or any combination of elements may be implemented as a "processing system" that includes one or more processors. Examples of processors include microprocessors, microcontrollers, graphics processing units (GPUs), central processing units (CPUs), application processors, digital signal processors (DSPs), reduced instruction set computing (RISC) processors, systems on a chip (SoC), baseband processors, field programmable gate arrays (FPGAs), programmable logic devices (PLDs), state machines, gated logic, discrete hardware circuits, and other suitable hardware configured to perform the various functionality described throughout this disclosure. One or more processors in the processing system may execute software. Software shall be construed broadly to mean instructions, instruction sets, code, code segments, program code, programs, subprograms, software components, applications, software applications, software packages, routines, subroutines, objects, executables, threads of execution, procedures, functions, etc., whether referred to as software, firmware, middleware, microcode, hardware description language, or otherwise.

Accordingly, in one or more example embodiments, the functions described may be implemented in hardware, software, or any combination thereof. If implemented in software, the functions may be stored on or encoded as one or more instructions or code on a computer-readable medium. Computer-readable media includes computer storage media. Storage media may be any available media that can be accessed by a computer. By way of example, and not limitation, such computer-readable media can comprise a random-access memory (RAM), a read-only memory (ROM), an electrically erasable programmable ROM (EEPROM), optical disk storage, magnetic disk storage, other magnetic storage devices, combinations of the aforementioned types of computer-readable media, or any other medium that can be used to store computer executable code in the form of instructions or data structures that can be accessed by a computer.

FIG. 1 is a diagram illustrating an example of a wireless communications system and an access network 100. The wireless communications system (also referred to as a wireless wide area network (WWAN)) includes base stations 102, UEs 104, and an Evolved Packet Core (EPC) 160. The base stations 102 may include macro cells (high power cellular base station) and/or small cells (low power cellular base station). The macro cells include base stations. The small cells include femtocells, picocells, and microcells.

The base stations 102 (collectively referred to as Evolved Universal Mobile Telecommunications System (UMTS) Terrestrial Radio Access Network (E-UTRAN)) interface with the EPC 160 through backhaul links 132 (e.g., S1 interface). In addition to other functions, the base stations 102 may perform one or more of the following functions: transfer of user data, radio channel ciphering and deciphering, integrity protection, header compression, mobility control functions (e.g., handover, dual connectivity), inter-cell interference coordination, connection setup and release, load balancing, distribution for non-access stratum (NAS) messages, NAS node selection, synchronization, radio access network (RAN) sharing, multimedia broadcast multicast service (MBMS), subscriber and equipment trace, RAN information management (RIM), paging, positioning, and delivery of warning messages. The base stations 102 may communicate directly or indirectly (e.g., through the EPC 160) with each other over backhaul links 134 (e.g., X2 interface). The backhaul links 134 may be wired or wireless.

The base stations 102 may wirelessly communicate with the UEs 104. Each of the base stations 102 may provide communication coverage for a respective geographic coverage area 110. There may be overlapping geographic coverage areas 1 10. For example, the small cell 102' may have a coverage area 110' that overlaps the coverage area 1 10 of one or more macro base stations 102. A network that includes both small cell and macro cells may be known as a heterogeneous network. A heterogeneous network may also include Home Evolved Node Bs (eNBs) (HeNBs), which may provide service to a restricted group known as a closed subscriber group (CSG). The communication links 120 between the base stations 102 and the UEs 104 may include uplink (UL) (also referred to as reverse link) transmissions from a UE 104 to a base station 102 and/or downlink (DL) (also referred to as forward link) transmissions from a base station 102 to a UE 104. The communication links 120 may use multiple-input and multiple-output (MIMO) antenna technology, including spatial multiplexing, beamforming, and/or transmit diversity. The communication links may be through one or more carriers. The base stations 102/UEs 104 may use spectrum up to Y MHz (e.g., 5, 10, 15, 20, 100 MHz) bandwidth per carrier allocated in a carrier aggregation of up to a total of Yx MHz (x component carriers) used for transmission in each direction. The carriers may or may not be adjacent to each other. Allocation of carriers may be asymmetric with respect to DL and UL (e.g., more or less carriers may be allocated for DL than for UL). The component carriers may include a primary component carrier and one or more secondary component carriers. A primary component carrier may be referred to as a primary cell (PCell) and a secondary component carrier may be referred to as a secondary cell (SCell).

The wireless communications system may further include a Wi-Fi access point (AP) 150 in communication with Wi-Fi stations (STAs) 152 via communication links 154 in a 5 GHz unlicensed frequency spectrum. When communicating in an unlicensed frequency spectrum, the STAs 152/AP 150 may perform a clear channel assessment (CCA) prior to communicating in order to determine whether the channel is available.

The small cell 102' may operate in a licensed and/or an unlicensed frequency spectrum. When operating in an unlicensed frequency spectrum, the small cell 102' may employ NR and use the same 5 GHz unlicensed frequency spectrum as used by the Wi-Fi AP 150. The small cell 102', employing NR in an unlicensed frequency spectrum, may boost coverage to and/or increase capacity of the access network.

The gNodeB (gNB) 180 may operate in millimeter wave (mmW) frequencies and/or near mmW frequencies in communication with the UE 104. When the gNB 180 operates in mmW or near mmW frequencies, the gNB 180 may be referred to as an mmW base station. Extremely high frequency (EHF) is part of the RF in the electromagnetic spectrum. EHF has a range of 30 GHz to 300 GHz and a wavelength between 1 millimeter and 10 millimeters. Radio waves in the band may be referred to as a millimeter wave. Near mmW may extend down to a frequency of 3 GHz with a wavelength of 100 millimeters. The super high frequency (SHF) band extends between 3 GHz and 30 GHz, also referred to as centimeter wave. Communications using the mmW/near mmW radio frequency band has extremely high path loss and a short range. The mmW base station 180 may utilize beamforming 184 with the UE 104 to compensate for the extremely high path loss and short range.

The EPC 160 may include a Mobility Management Entity (MME) 162, other MMEs 164, a Serving Gateway 166, a Multimedia Broadcast Multicast Service (MBMS) Gateway 168, a Broadcast Multicast Service Center (BM-SC) 170, and a Packet Data Network (PDN) Gateway 172. The MME 162 may be in communication with a Home Subscriber Server (HSS) 174. The MME 162 is the control node that processes the signaling between the UEs 104 and the EPC 160. Generally, the MME 162 provides bearer and connection management. All user Internet protocol (IP) packets are transferred through the Serving Gateway 166, which itself is connected to the PDN Gateway 172. The PDN Gateway 172 provides UE IP address allocation as well as other functions. The PDN Gateway 172 and the BM-SC 170 are connected to the IP Services 176. The IP Services 176 may include the Internet, an intranet, an IP Multimedia Subsystem (IMS), a PS Streaming Service (PSS), and/or other IP services. The BM-SC 170 may provide functions for MBMS user service provisioning and delivery. The BM-SC 170 may serve as an entry point for content provider MBMS transmission, may be used to authorize and initiate MBMS Bearer Services within a public land mobile network (PLMN), and may be used to schedule MBMS transmissions. The MBMS Gateway 168 may be used to distribute MBMS traffic to the base stations 102 belonging to a Multicast Broadcast Single Frequency Network (MBSFN) area broadcasting a particular service, and may be responsible for session management (start/stop) and for collecting eMBMS related charging information.

The base station may also be referred to as a gNB, Node B, evolved Node B (eNB), an access point, a base transceiver station, a radio base station, a radio transceiver, a transceiver function, a basic service set (BSS), an extended service set (ESS), or some other suitable terminology. The base station 102 provides an access point to the EPC 160 for a UE 104. Examples of UEs 104 include a cellular phone, a smart phone, a session initiation protocol (SIP) phone, a laptop, a personal digital assistant (PDA), a satellite radio, a global positioning system, a multimedia device, a video device, a digital audio player (e.g., MP3 player), a camera, a game console, a tablet, a smart device, a wearable device, a vehicle, an electric meter, a gas pump, a toaster, or any other similar functioning device. Some of the UEs 104 may be referred to as IoT devices (e.g., parking meter, gas pump, toaster, vehicles, etc.). The UE 104 may also be referred to as a station, a mobile station, a subscriber station, a mobile unit, a subscriber unit, a wireless unit, a remote unit, a mobile device, a wireless device, a wireless communications device, a remote device, a mobile subscriber station, an access terminal, a mobile terminal, a wireless terminal, a remote terminal, a handset, a user agent, a mobile client, a client, or some other suitable terminology.

Figure 2:
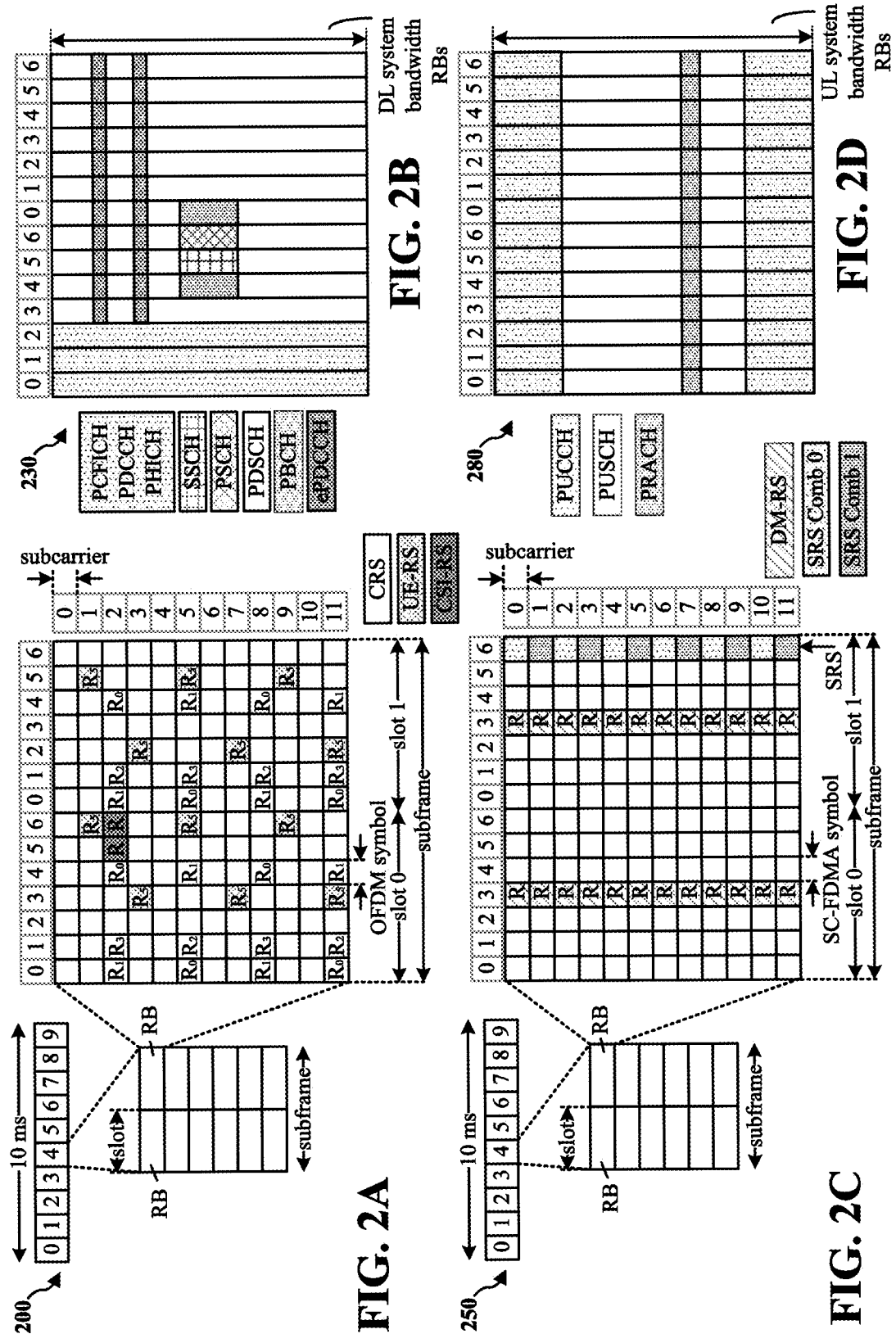
FIGS. 2A, 2B, 2C, and 2D are diagrams illustrating examples of a DL frame structure, DL channels within the DL frame structure, an UL frame structure, and UL channels within the UL frame structure, respectively.

FIG. 2A is a diagram 200 illustrating an example of a DL frame structure. FIG. 2B is a diagram 230 illustrating an example of channels within the DL frame structure. FIG. 2C is a diagram 250 illustrating an example of an UL frame structure. FIG. 2D is a diagram 280 illustrating an example of channels within the UL frame structure. Other wireless communication technologies may have a different frame structure and/or different channels. A frame (10 ms) may be divided into 10 equally sized subframes. Each subframe may include two consecutive time slots. A resource grid may be used to represent the two time slots, each time slot including one or more time concurrent resource blocks (RBs) (also referred to as physical RBs (PRBs)). The resource grid is divided into multiple resource elements (REs). For a normal cyclic prefix, an RB contains 12 consecutive subcarriers in the frequency domain and 7 consecutive symbols (for DL, OFDM symbols; for UL, SC-FDMA symbols) in the time domain, for a total of 84 REs. For an extended cyclic prefix, an RB contains 12 consecutive subcarriers in the frequency domain and 6 consecutive symbols in the time domain, for a total of 72 REs. The number of bits carried by each RE depends on the modulation scheme.

As illustrated in FIG. 2A, some of the REs carry DL reference (pilot) signals (DL-RS) for channel estimation at the UE. The DL-RS may include cell-specific reference signals (CRS) (also sometimes called common RS), UE-specific reference signals (UE-RS), and channel state information reference signals (CSI-RS). FIG. 2A illustrates CRS for antenna ports 0, 1, 2, and 3 (indicated as R0, R1, R2, and R3, respectively), UE-RS for antenna port 5 (indicated as R5), and CSI-RS for antenna port 15 (indicated as R). FIG. 2B illustrates an example of various channels within a DL subframe of a frame. The physical control format indicator channel (PCFICH) is within symbol 0 of slot 0, and carries a control format indicator (CFI) that indicates whether the physical downlink control channel (PDCCH) occupies 1, 2, or 3 symbols (FIG. 2B illustrates a PDCCH that occupies 3 symbols). The PDCCH carries downlink control information (DCI) within one or more control channel elements (CCEs), each CCE including nine RE groups (REGs), each REG including four consecutive REs in an OFDM symbol. A UE may be configured with a UE-specific enhanced PDCCH (ePDCCH) that also carries DCI. The ePDCCH may have 2, 4, or 8 RB pairs (FIG. 2B shows two RB pairs, each subset including one RB pair). The physical hybrid automatic repeat request (ARQ) (HARQ) indicator channel (PHICH) is also within symbol 0 of slot 0 and carries the HARQ indicator (HI) that indicates HARQ acknowledgement (ACK)/negative ACK (NACK) feedback based on the physical uplink shared channel (PUSCH). The primary synchronization channel (PSCH) may be within symbol 6 of slot 0 within subframes 0 and 5 of a frame. The PSCH carries a primary synchronization signal (PSS) that is used by a UE to determine subframe/symbol timing and a physical layer identity. The secondary synchronization channel (SSCH) may be within symbol 5 of slot 0 within subframes 0 and 5 of a frame. The SSCH carries a secondary synchronization signal (SSS) that is used by a UE to determine a physical layer cell identity group number and radio frame timing. Based on the physical layer identity and the physical layer cell identity group number, the UE can determine a physical cell identifier (PCI). Based on the PCI, the UE can determine the locations of the aforementioned DL-RS. The physical broadcast channel (PBCH), which carries a master information block (MIB), may be logically grouped with the PSCH and SSCH to form a synchronization signal (SS) block. The MIB provides a number of RBs in the DL system bandwidth, a PHICH configuration, and a system frame number (SFN). The physical downlink shared channel (PDSCH) carries user data, broadcast system information not transmitted through the PBCH such as system information blocks (SIBs), and paging messages.

As illustrated in FIG. 2C, some of the REs carry demodulation reference signals (DM-RS) for channel estimation at the base station. The UE may additionally transmit sounding reference signals (SRS) in the last symbol of a subframe. The SRS may have a comb structure, and a UE may transmit SRS on one of the combs. The SRS may be used by a base station for channel quality estimation to enable frequency-dependent scheduling on the UL. FIG. 2D illustrates an example of various channels within an UL subframe of a frame. A physical random access channel (PRACH) may be within one or more subframes within a frame based on the PRACH configuration. The PRACH may include six consecutive RB pairs within a subframe. The PRACH allows the UE to perform initial system access and achieve UL synchronization. A physical uplink control channel (PUCCH) may be located on edges of the UL system bandwidth. The PUCCH carries uplink control information (UCI), such as scheduling requests, a channel quality indicator (CQI), a precoding matrix indicator (PMI), a rank indicator (RI), and HARQ ACK/NACK feedback. The PUSCH carries data, and may additionally be used to carry a buffer status report (BSR), a power headroom report (PHR), and/or UCI.

Figure 3:
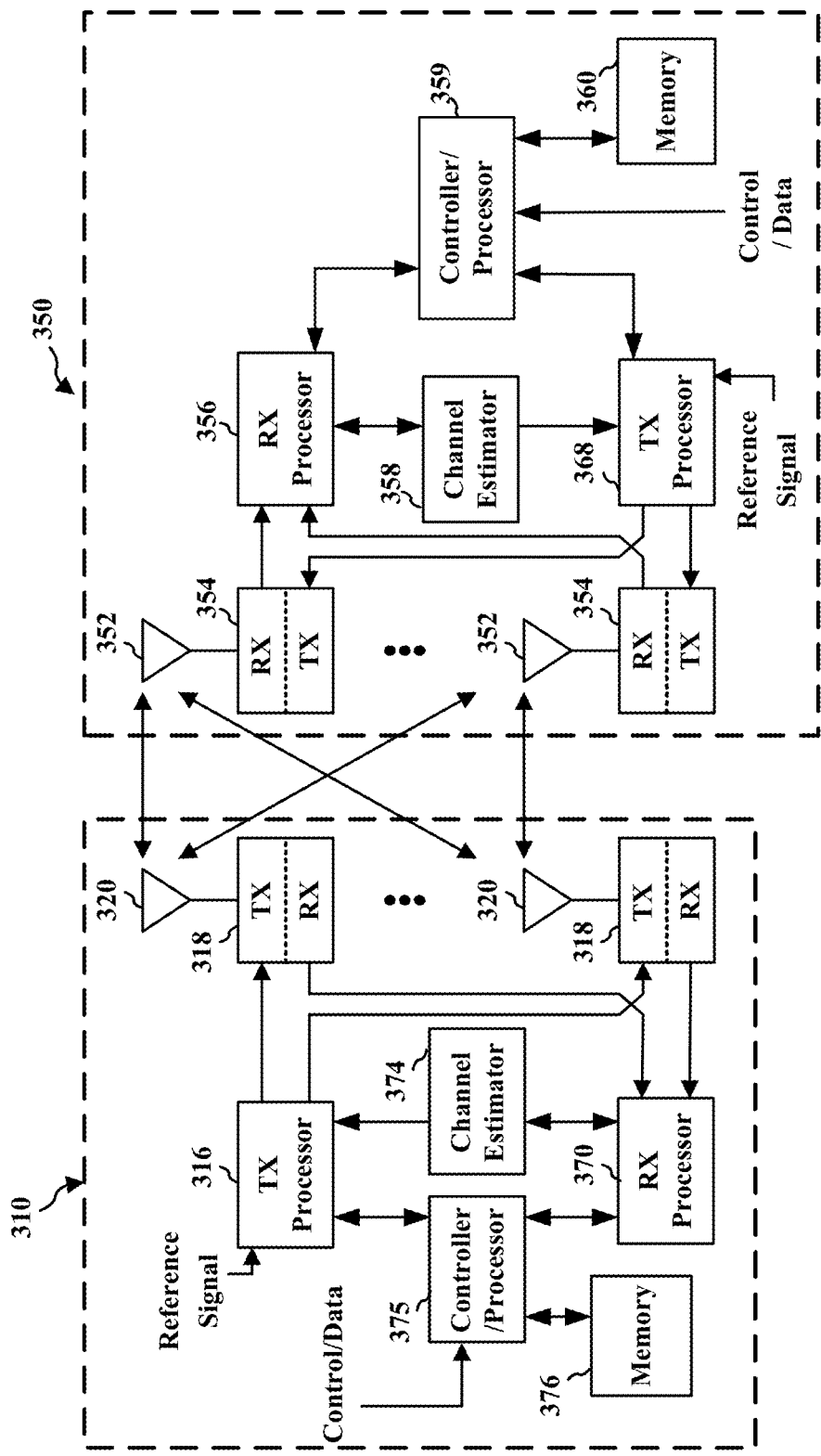
FIG. 3 is a diagram illustrating a base station in communication with a UE in an access network.

FIG. 3 is a block diagram of a base station 310 in communication with a UE 350 in an access network. In the DL, IP packets from the EPC 160 may be provided to a controller/processor 375. The controller/processor 375 implements layer 3 and layer 2 functionality. Layer 3 includes a radio resource control (RRC) layer, and layer 2 includes a packet data convergence protocol (PDCP) layer, a radio link control (RLC) layer, and a medium access control (MAC) layer. The controller/processor 375 provides RRC layer functionality associated with broadcasting of system information (e.g., MIB, SIBs), RRC connection control (e.g., RRC connection paging, RRC connection establishment, RRC connection modification, and RRC connection release), inter radio access technology (RAT) mobility, and measurement configuration for UE measurement reporting; PDCP layer functionality associated with header compression/decompression, security (ciphering, deciphering, integrity protection, integrity verification), and handover support functions; RLC layer functionality associated with the transfer of upper layer packet data units (PDUs), error correction through ARQ, concatenation, segmentation, and reassembly of RLC service data units (SDUs), re-segmentation of RLC data PDUs, and reordering of RLC data PDUs; and MAC layer functionality associated with mapping between logical channels and transport channels, multiplexing of MAC SDUs onto transport blocks (TBs), demultiplexing of MAC SDUs from TBs, scheduling information reporting, error correction through HARQ, priority handling, and logical channel prioritization.

The transmit (TX) processor 316 and the receive (RX) processor 370 implement layer 1 functionality associated with various signal processing functions. Layer 1, which includes a physical (PHY) layer, may include error detection on the transport channels, forward error correction (FEC) coding/decoding of the transport channels, interleaving, rate matching, mapping onto physical channels, modulation/demodulation of physical channels, and MIMO antenna processing. The TX processor 316 handles mapping to signal constellations based on various modulation schemes (e.g., binary phase-shift keying (BPSK), quadrature phase-shift keying (QPSK), M-phase-shift keying (M-PSK), M-quadrature amplitude modulation (M-QAM)). The coded and modulated symbols may then be split into parallel streams. Each stream may then be mapped to an OFDM subcarrier, multiplexed with a reference signal (e.g., pilot) in the time and/or frequency domain, and then combined together using an Inverse Fast Fourier Transform (IFFT) to produce a physical channel carrying a time domain OFDM symbol stream. The OFDM stream is spatially precoded to produce multiple spatial streams. Channel estimates from a channel estimator 374 may be used to determine the coding and modulation scheme, as well as for spatial processing. The channel estimate may be derived from a reference signal and/or channel condition feedback transmitted by the UE 350. Each spatial stream may then be provided to a different antenna 320 via a separate transmitter 318TX. Each transmitter 318TX may modulate an RF carrier with a respective spatial stream for transmission.

At the UE 350, each receiver 354RX receives a signal through its respective antenna 352. Each receiver 354RX recovers information modulated onto an RF carrier and provides the information to the receive (RX) processor 356. The TX processor 368 and the RX processor 356 implement layer 1 functionality associated with various signal processing functions. The RX processor 356 may perform spatial processing on the information to recover any spatial streams destined for the UE 350. If multiple spatial streams are destined for the UE 350, they may be combined by the RX processor 356 into a single OFDM symbol stream. The RX processor 356 then converts the OFDM symbol stream from the time-domain to the frequency domain using a Fast Fourier Transform (FFT). The frequency domain signal comprises a separate OFDM symbol stream for each subcarrier of the OFDM signal. The symbols on each subcarrier, and the reference signal, are recovered and demodulated by determining the most likely signal constellation points transmitted by the base station 310. These soft decisions may be based on channel estimates computed by the channel estimator 358. The soft decisions are then decoded and deinterleaved to recover the data and control signals that were originally transmitted by the base station 310 on the physical channel. The data and control signals are then provided to the controller/processor 359, which implements layer 3 and layer 2 functionality.

The controller/processor 359 can be associated with a memory 360 that stores program codes and data. The memory 360 may be referred to as a computer-readable medium. In the UL, the controller/processor 359 provides demultiplexing between transport and logical channels, packet reassembly, deciphering, header decompression, and control signal processing to recover IP packets from the EPC 160. The controller/processor 359 is also responsible for error detection using an ACK and/or NACK protocol to support HARQ operations.

Similar to the functionality described in connection with the DL transmission by the base station 310, the controller/processor 359 provides RRC layer functionality associated with system information (e.g., MIB, SIBs) acquisition, RRC connections, and measurement reporting; PDCP layer functionality associated with header compression/decompression, and security (ciphering, deciphering, integrity protection, integrity verification); RLC layer functionality associated with the transfer of upper layer PDUs, error correction through ARQ, concatenation, segmentation, and reassembly of RLC SDUs, re-segmentation of RLC data PDUs, and reordering of RLC data PDUs; and MAC layer functionality associated with mapping between logical channels and transport channels, multiplexing of MAC SDUs onto TBs, demultiplexing of MAC SDUs from TBs, scheduling information reporting, error correction through HARQ, priority handling, and logical channel prioritization.

Channel estimates derived by a channel estimator 358 from a reference signal or feedback transmitted by the base station 310 may be used by the TX processor 368 to select the appropriate coding and modulation schemes, and to facilitate spatial processing. The spatial streams generated by the TX processor 368 may be provided to different antenna 352 via separate transmitters 354TX. Each transmitter 354TX may modulate an RF carrier with a respective spatial stream for transmission. The UL transmission is processed at the base station 310 in a manner similar to that described in connection with the receiver function at the UE 350. Each receiver 318RX receives a signal through its respective antenna 320. Each receiver 318RX recovers information modulated onto an RF carrier and provides the information to a RX processor 370.

The controller/processor 375 can be associated with a memory 376 that stores program codes and data. The memory 376 may be referred to as a computer-readable medium. In the UL, the controller/processor 375 provides demultiplexing between transport and logical channels, packet reassembly, deciphering, header decompression, control signal processing to recover IP packets from the UE 350. IP packets from the controller/processor 375 may be provided to the EPC 160. The controller/processor 375 is also responsible for error detection using an ACK and/or NACK protocol to support HARQ operations.

New radio (NR) may refer to radios configured to operate according to a new air interface (e.g., other than Orthogonal Frequency Divisional Multiple Access (OFDMA)-based air interfaces) or fixed transport layer (e.g., other than Internet Protocol (IP)). NR may utilize OFDM with a cyclic prefix (CP) on the uplink and downlink and may include support for half-duplex operation using time division duplexing (TDD). NR may include Enhanced Mobile Broadband (eMBB) service targeting wide bandwidth (e.g. 80 MHz beyond), millimeter wave (mmW) targeting high carrier frequency (e.g. 60 GHz), massive MTC (mMTC) targeting non-backward compatible MTC techniques, and/or mission critical targeting ultra-reliable low latency communications (URLLC) service.

A single component carrier bandwidth of 100 MHZ may be supported. In one example, NR resource blocks (RBs) may span 12 sub-carriers with a sub-carrier bandwidth of 75 kHz over a 0.1 ms duration or a bandwidth of 15 kHz over a 1 ms duration. Each radio frame may consist of 10 or 50 subframes with a length of 10 ms. Each subframe may have a length of 0.2 ms. Each subframe may indicate a link direction (i.e., DL or UL) for data transmission and the link direction for each subframe may be dynamically switched. Each subframe may include DL/UL data as well as DL/UL control data. UL and DL subframes for NR may be as described in more detail below with respect to FIGS. 6 and 7.

Beamforming may be supported and beam direction may be dynamically configured. MIMO transmissions with precoding may also be supported. MIMO configurations in the DL may support up to 8 transmit antennas with multi-layer DL transmissions up to 8 streams and up to 2 streams per UE. Multi-layer transmissions with up to 2 streams per UE may be supported. Aggregation of multiple cells may be supported with up to 8 serving cells. Alternatively, NR may support a different air interface, other than an OFDM-based interface.

The NR RAN may include a central unit (CU) and distributed units (DUs). A NR BS (e.g., gNB, 5G Node B, Node B, transmission reception point (TRP), access point (AP)) may correspond to one or multiple BSs. NR cells can be configured as access cells (ACells) or data only cells (DCells). For example, the RAN (e.g., a central unit or distributed unit) can configure the cells. DCells may be cells used for carrier aggregation or dual connectivity and may not be used for initial access, cell selection/reselection, or handover. In some cases DCells may not transmit synchronization signals (SS) in some cases DCells may transmit SS. NR BSs may transmit downlink signals to UEs indicating the cell type. Based on the cell type indication, the UE may communicate with the NR BS. For example, the UE may determine NR BSs to consider for cell selection, access, handover, and/or measurement based on the indicated cell type.

Figure 4:
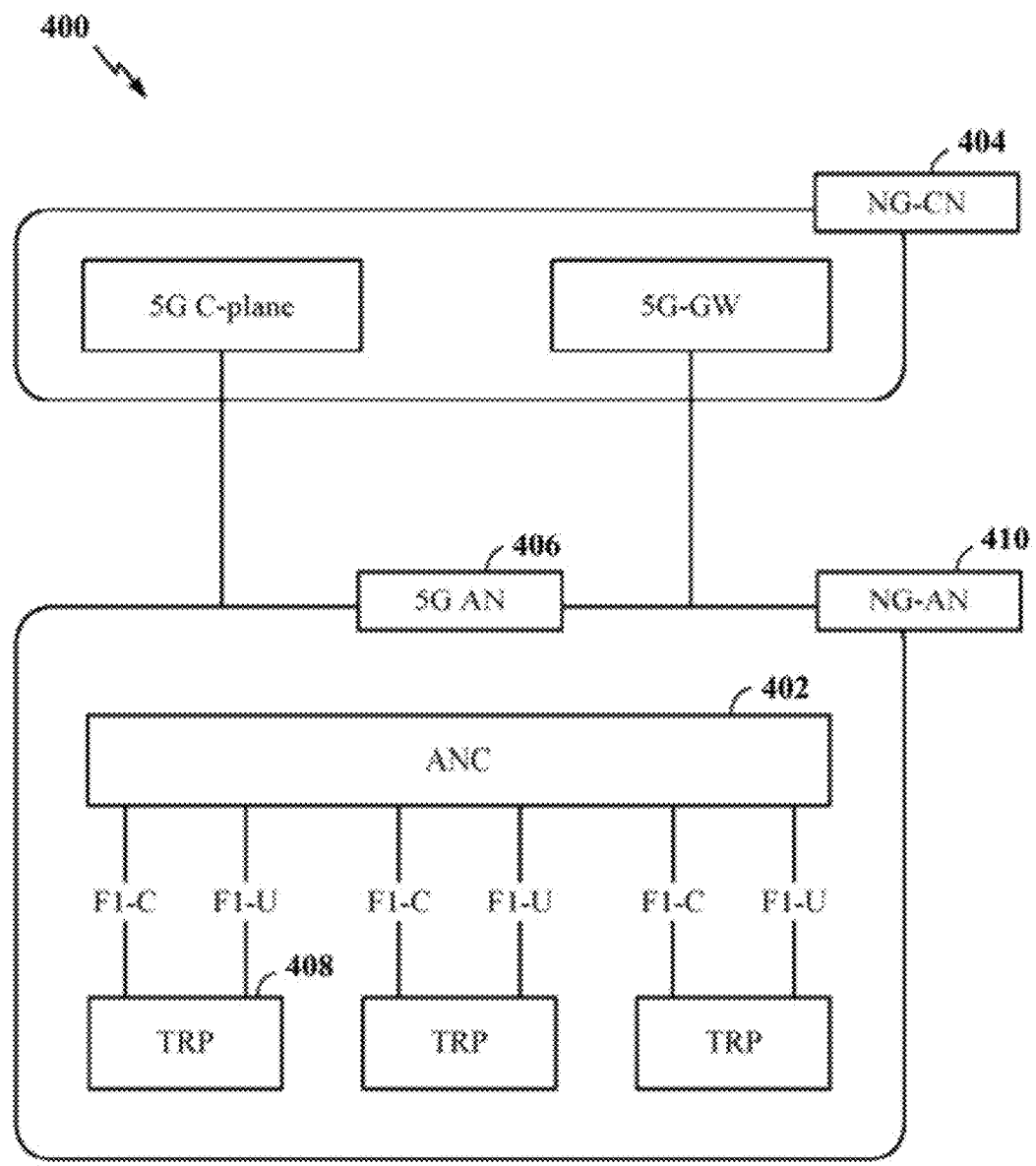
FIG. 4 illustrates an example logical architecture of a distributed access network.

FIG. 4 illustrates an example logical architecture 400 of a distributed RAN, according to aspects of the present disclosure. A 5G access node 406 may include an access node controller (ANC) 402. The ANC may be a central unit (CU) of the distributed RAN 400. The backhaul interface to the next generation core network (NG-CN) 404 may terminate at the ANC. The backhaul interface to neighboring next generation access nodes (NG-ANs) may terminate at the ANC. The ANC may include one or more TRPs 408 (which may also be referred to as BSs, NR BSs, Node Bs, 5G NBs, APs, or some other term). As described above, a TRP may be used interchangeably with "cell."

The TRPs 408 may be a distributed unit (DU). The TRPs may be connected to one ANC (ANC 402) or more than one ANC (not illustrated). For example, for RAN sharing, radio as a service (RaaS), and service specific AND deployments, the TRP may be connected to more than one ANC. A TRP may include one or more antenna ports. The TRPs may be configured to individually (e.g., dynamic selection) or jointly (e.g., joint transmission) serve traffic to a UE.

The local architecture of the distributed RAN 400 may be used to illustrate fronthaul definition. The architecture may be defined that support fronthauling solutions across different deployment types. For example, the architecture may be based on transmit network capabilities (e.g., bandwidth, latency, and/or jitter). The architecture may share features and/or components with LTE. According to aspects, the next generation AN (NG-AN) 410 may support dual connectivity with NR. The NG-AN may share a common fronthaul for LTE and NR.

The architecture may enable cooperation between and among TRPs 408. For example, cooperation may be preset within a TRP and/or across TRPs via the ANC 402. According to aspects, no inter-TRP interface may be needed/present.

According to aspects, a dynamic configuration of split logical functions may be present within the architecture of the distributed RAN 400. The PDCP, RLC, MAC protocol may be adaptably placed at the ANC or TRP.

Figure 5:
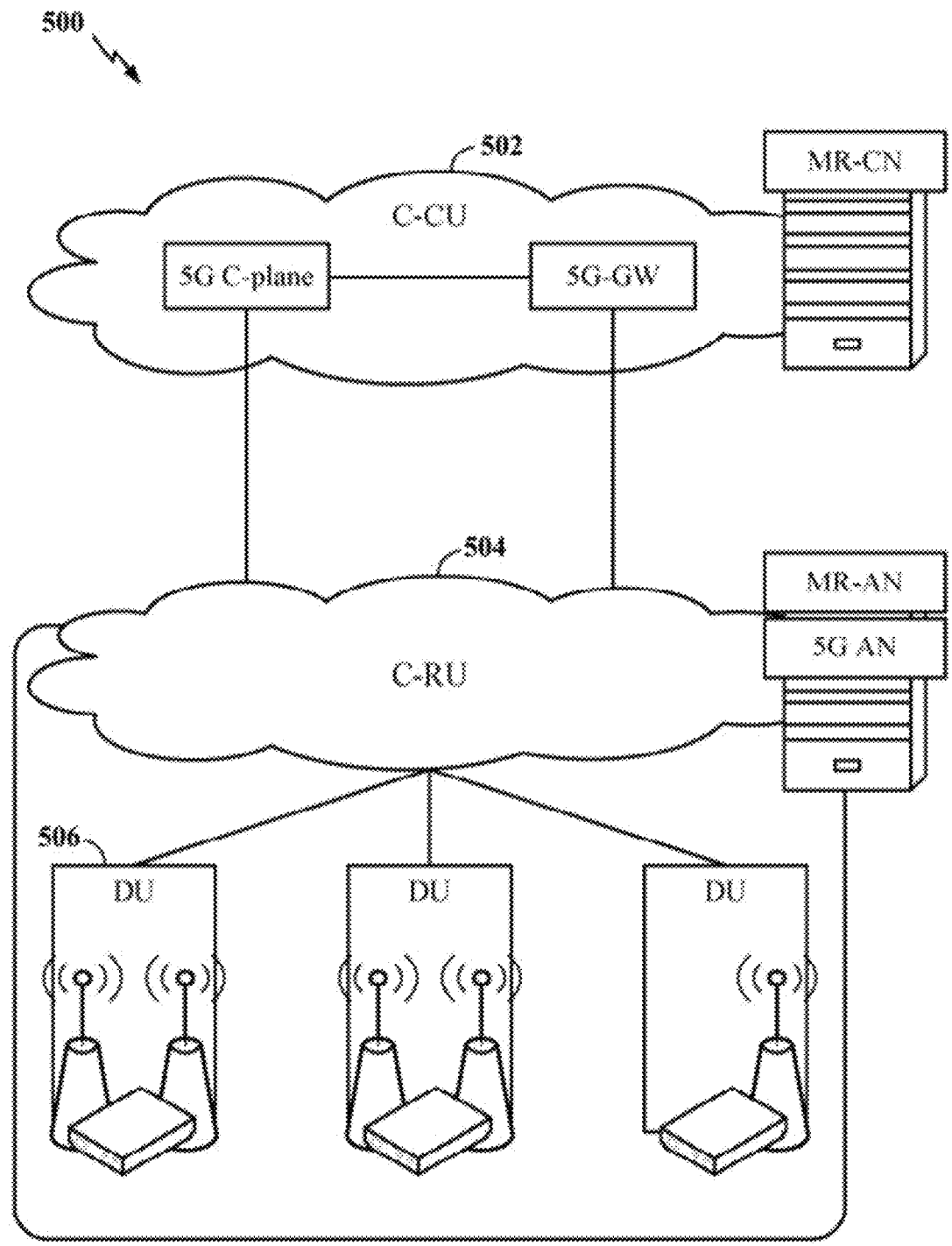
FIG. 5 illustrates an example physical architecture of a distributed access network.

FIG. 5 illustrates an example physical architecture of a distributed RAN 500, according to aspects of the present disclosure. A centralized core network unit (C-CU) 502 may host core network functions. The C-CU may be centrally deployed. C-CU functionality may be offloaded (e.g., to advanced wireless services (AWS)), in an effort to handle peak capacity. A centralized RAN unit (C-RU) 504 may host one or more ANC functions. Optionally, the C-RU may host core network functions locally. The C-RU may have distributed deployment. The C-RU may be closer to the network edge. A distributed unit (DU) 506 may host one or more TRPs. The DU may be located at edges of the network with radio frequency (RF) functionality.

Figure 6:
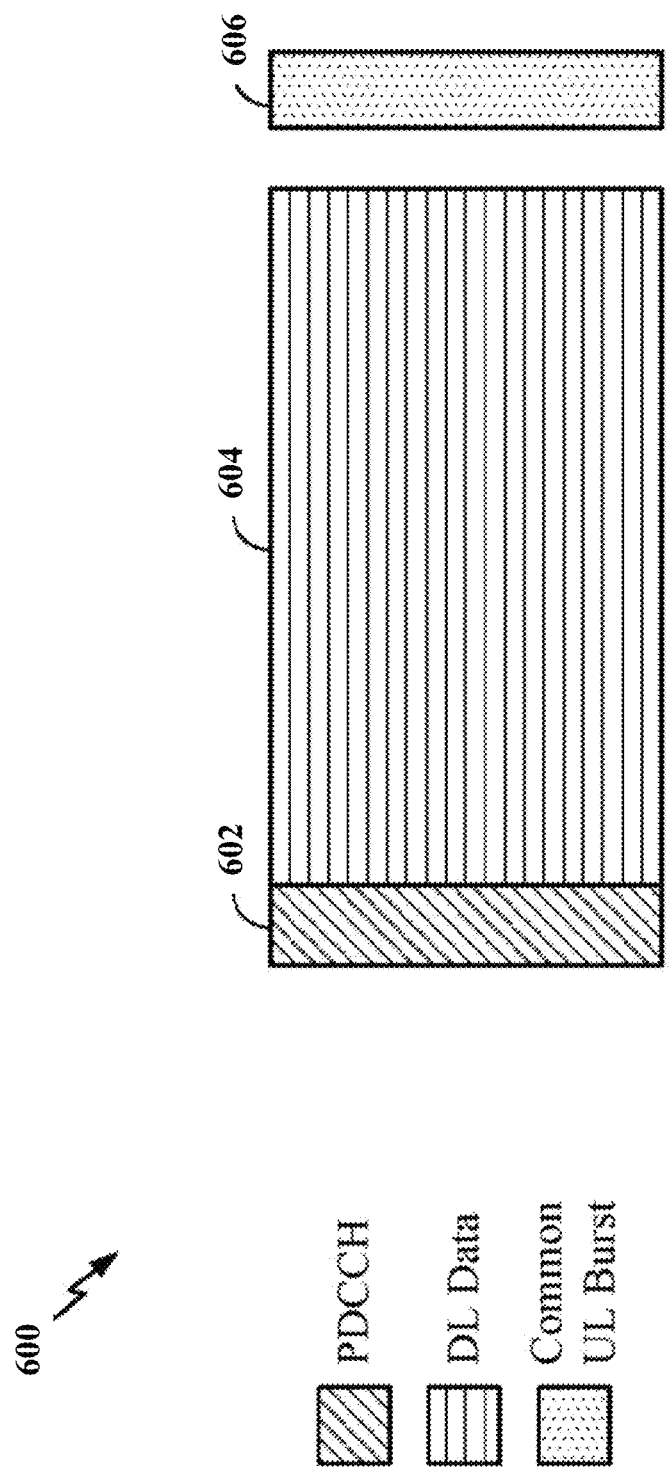
FIG. 6 is a diagram showing an example of a DL-centric subframe.

FIG. 6 is a diagram 600 showing an example of a DL-centric subframe. The DL-centric subframe may include a control portion 602. The control portion 602 may exist in the initial or beginning portion of the DL-centric subframe. The control portion 602 may include various scheduling information and/or control information corresponding to various portions of the DL-centric subframe. In some configurations, the control portion 602 may be a physical DL control channel (PDCCH), as indicated in FIG. 6. The DL-centric subframe may also include a DL data portion 604. The DL data portion 604 may sometimes be referred to as the payload of the DL-centric subframe. The DL data portion 604 may include the communication resources utilized to communicate DL data from the scheduling entity (e.g., UE or BS) to the subordinate entity (e.g., UE). In some configurations, the DL data portion 604 may be a physical DL shared channel (PDSCH).

The DL-centric subframe may also include a common UL portion 606. The common UL portion 606 may sometimes be referred to as an UL burst, a common UL burst, and/or various other suitable terms. The common UL portion 606 may include feedback information corresponding to various other portions of the DL-centric subframe. For example, the common UL portion 606 may include feedback information corresponding to the control portion 602. Non-limiting examples of feedback information may include an ACK signal, a NACK signal, a HARQ indicator, and/or various other suitable types of information. The common UL portion 606 may include additional or alternative information, such as information pertaining to random access channel (RACH) procedures, scheduling requests (SRs), and various other suitable types of information.

As illustrated in FIG. 6, the end of the DL data portion 604 may be separated in time from the beginning of the common UL portion 606. This time separation may sometimes be referred to as a gap, a guard period, a guard interval, and/or various other suitable terms. This separation provides time for the switch-over from DL communication (e.g., reception operation by the subordinate entity (e.g., UE)) to UL communication (e.g., transmission by the subordinate entity (e.g., UE)). One of ordinary skill in the art will understand that the foregoing is merely one example of a DL-centric subframe and alternative structures having similar features may exist without necessarily deviating from the aspects described herein.

Figure 7:
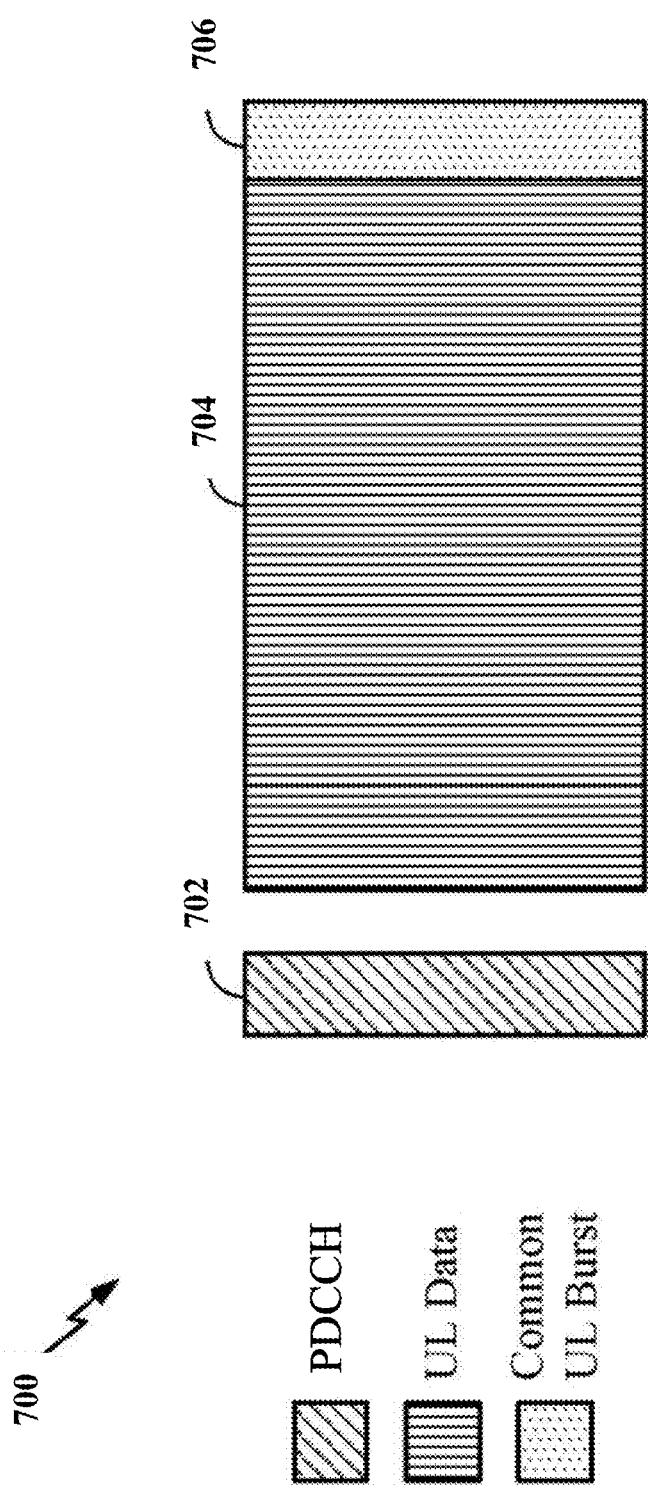
FIG. 7 is a diagram showing an example of an UL-centric subframe.

FIG. 7 is a diagram 700 showing an example of an UL-centric subframe. The UL-centric subframe may include a control portion 702. The control portion 702 may exist in the initial or beginning portion of the UL-centric subframe. The control portion 702 in FIG. 7 may be similar to the control portion 602 described above with reference to FIG. 6. The UL-centric subframe may also include an UL data portion 704. The UL data portion 704 may sometimes be referred to as the pay load of the UL-centric subframe. The UL portion may refer to the communication resources utilized to communicate UL data from the subordinate entity (e.g., UE) to the scheduling entity (e.g., UE or BS). In some configurations, the control portion 702 may be a physical DL control channel (PDCCH).

As illustrated in FIG. 7, the end of the control portion 702 may be separated in time from the beginning of the UL data portion 704. This time separation may sometimes be referred to as a gap, guard period, guard interval, and/or various other suitable terms. This separation provides time for the switch-over from DL communication (e.g., reception operation by the scheduling entity) to UL communication (e.g., transmission by the scheduling entity). The UL-centric subframe may also include a common UL portion 706. The common UL portion 706 in FIG. 7 may be similar to the common UL portion 706 described above with reference to FIG. 7. The common UL portion 706 may additionally or alternatively include information pertaining to channel quality indicator (CQI), sounding reference signals (SRSs), and various other suitable types of information. One of ordinary skill in the art will understand that the foregoing is merely one example of an UL-centric subframe and alternative structures having similar features may exist without necessarily deviating from the aspects described herein.

In some circumstances, two or more subordinate entities (e.g., UEs) may communicate with each other using sidelink signals. Real-world applications of such sidelink communications may include public safety, proximity services, UE-to-network relaying, vehicle-to-vehicle (V2V) communications, Internet of Everything (IoE) communications, IoT communications, mission-critical mesh, and/or various other suitable applications. Generally, a sidelink signal may refer to a signal communicated from one subordinate entity (e.g., UE1) to another subordinate entity (e.g., UE2) without relaying that communication through the scheduling entity (e.g., UE or BS), even though the scheduling entity may be utilized for scheduling and/or control purposes. In some examples, the sidelink signals may be communicated using a licensed spectrum (unlike wireless local area networks, which typically use an unlicensed spectrum).

Figure 8:
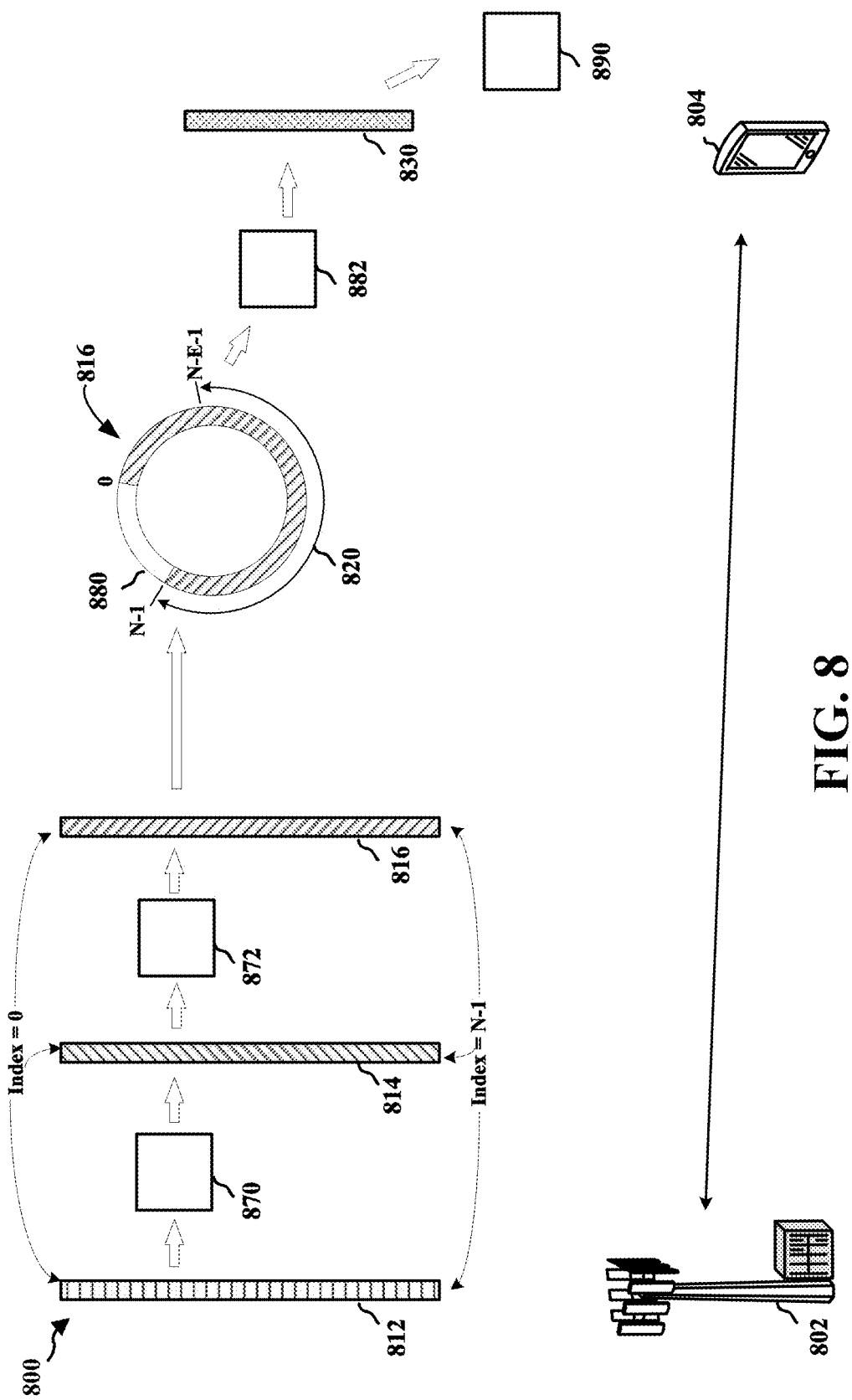
FIG. 8 is a diagram illustrating communications between a base station and UE.

FIG. 8 is a diagram 800 illustrating communications between a UE 804 and base station 802. In this example, the base station 802 generates a sequence of information bits 812. For example, the sequence of information bits 812 may be for a PDCCH. The sequence of information bits 812 is sent to a polar code encoder 870, which generates a sequence of encoded bits 814. The sequence of encoded bits 814 is sent to a rate-matching interleaver 872, which interleaves the sequence of encoded bits 814 to generate a sequence of encoded bits 816. The bits in the sequence of information bits 812, the sequence of encoded bits 814, and the sequence of encoded bits 816 may be indexed from 0 to (N−1).

In certain configurations, the base station 802 then places the sequence of encoded bits 816 in a circular buffer 880. As such, the circular buffer 880 holds the sequence of encoded bits 816. The sequence of encoded bits 816 can also be indexed from 0 to (N−1). The base station 802 can further manipulate the sequence of encoded bits 816, such as puncturing, shortening, and repeating one or more parts of the sequence of encoded bits 816, to obtain a section of bits 820. The base station 802 selects the section of bits 820 from the sequence of encoded bits 816 and sends the section of bits 820 to a channel bit interleaver 882. In particular, the section of bits 820 may contain consecutive bits to an extent that matches the number of available resource elements in the resource blocks assigned for the transmission. This procedure is so-called rate matching.

Due to characteristics of the polar code encoder 870 as described infra, in certain circumstances, in the sequence of encoded bits 814 output from the polar code encoder 870 (indexed from 0 to N−1 consecutively), a particular encoded bit has a higher importance than that of another encoded bit of a lower index. For example, the bit with an index of N/2 is more important than the bit with an index of (N/2)−1. When the rate-matching interleaver 872 interleaves the sequence of encoded bits 814, the rate-matching interleaver 872 also maintains some of that order of importance in the sequence of encoded bits 816.

When the base station 802 punctures the sequence of encoded bits 816 (as shown in FIG. 8), the base station 802 may select bits indexed from (N−E−1) to (N−1) as the section of bits 820. In other words, the base station 802 selects an end portion of the sequence of encoded bits 816 that include E bits to form the section of bits 820.

When the base station 802 shortens the sequence of encoded bits 816 (not shown in FIG. 8), the base station 802 may select bits indexed from 0 to (E−1) as the section of bits 820. In other words, the base station 802 selects a beginning portion of the sequence of encoded bits 816 that include E bits to form the section of bits 820.

The channel bit interleaver 882 interleaves the section of bits 820 and generates a sequence of encoded bits 830. Bits from the sequence of encoded bits 830 are then sent to the modulation component 890 to be mapped to modulation bits of one or more symbols. The base station 802 then transmits the symbols to the UE 804.

Although in this disclosure examples are given referring to the base station 802, it is noted that the UE 804 can perform the same operations described herein.

Figure 9:
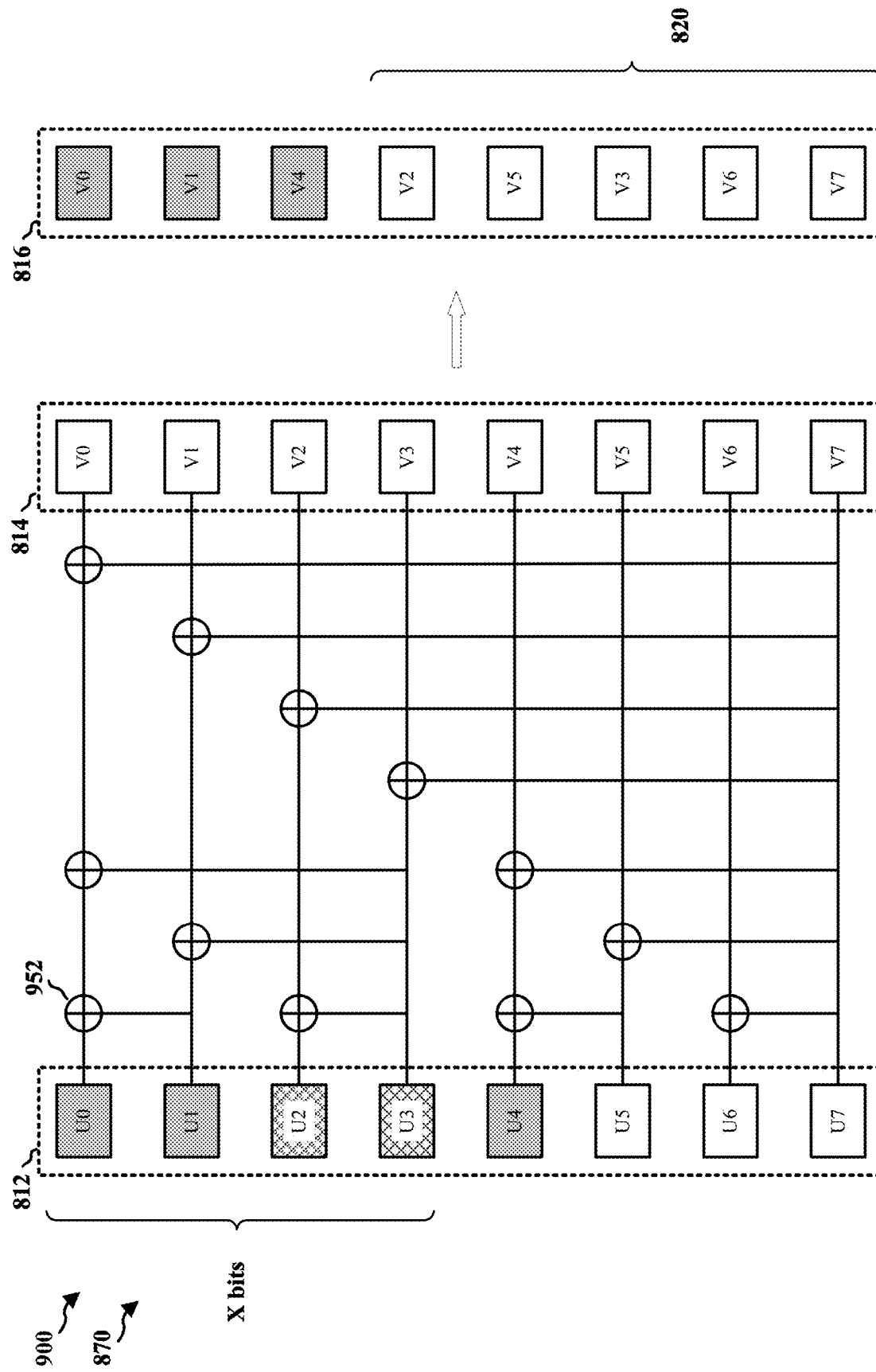
FIG. 9 is a diagram illustrating a simplified polar code encoder.

FIG. 9 is a diagram 900 illustrating a simplified polar code encoder 870. The polar code encoder 870 may have N inputs and N outputs. In this example, N is 8. That is, the polar code encoder 870 includes 8 inputs and 8 outputs. A pair of input and output having the same index are connected by an input channel. An input in one input channel may be applied an exclusive OR (XOR) operation 952 with an input from an adjacent input channel. Polar code is designed to polarize part of the inputs. Quality of part of the channels become worse and worse, and quality of part of the channels become better and better.

The inputs and outputs of the polar code encoder 870 can be indexed from 0 to N−1. Further, the bits of the sequence of information bits 812, which are input to the polar code encoder 870, are identified as U0-U7 in accordance with the indices of the inputs. The bits of the sequence of encoded bits 814, which are output from the polar code encoder 870, are identified as V0-V7 in accordance with the indices of the outputs. As described supra, the rate-matching interleaver 872 interleaves the sequence of encoded bits 814 to generate the sequence of encoded bits 816. In this example, the sequence of encoded bits 814 with bits {V0, V1, V2, V3, V4, V5, V6, V7} becomes the sequence of encoded bits 816 with bits {V0, V1, V2, V4, V3, V5, V6, V7}.

As described supra, the base station 802 punctures the sequence of encoded bits 816 to obtain the section of bits 820 that include E bits. In this example, E is 5. Therefore, the beginning portion of the sequence of encoded bits 816, which are encoded bits V0, V1, and V4 in this example, will not be transmitted. For the UE 804, these untransmitted encoded bits cannot be reliably decoded. In one technique, bits at the inputs corresponding to those untransmitted bits are set at a predetermined value (e.g., 0) and are considered as "frozen." In this example, bits U0, U1, and U4 are frozen.

Since the polar code structure is impacted with rate-matching, for those unfrozen input bit channels with smaller index, the performance can become worse than the case without rate-matching. In one technique, when the sequence of encoded bits 816 is punctured to generate the section of bits 820, for the unfrozen input bit channels, the base station 802 may additionally freeze F bits having small input indices, F being an integer. More specifically, in one technique, the base station 802 may freeze the initial X bits having indices from 0 to (X−1) in the sequence of information bits 812, X being an integer greater than 1. X can be determined based on E and N described supra, and in particular based on the number of remaining encoded bits in the upper half portion of the sequence of encoded bits 816. The initial X bits may include one or more bits that are already frozen as those bits correspond to encoded bits not to be transmitted. Any bits left in the initial X bits that have not been frozen will be frozen under this technique. When the sequence of encoded bits 816 is shortened to generate the section of bits 820 (e.g., there is no untransmitted encoded bits in the upper half portion of the sequence of encoded bits 816), the base station 802 may not additionally freeze any bits. This technique may avoid poor input bits and improve performance.

In this example, the base station 802 determines that X is 4. That is, the base station 802 determines the bits U0, U1, U2, and U3 should all be frozen. The bits U0 and U1 within the initial 4 bits are determined to be frozen already as they correspond to the encoded bits V0 and V1, which are to be punctured from the sequence of encoded bits 816. Under this technique, the base station 802 determines to additionally freeze the bits U2 and U3. The bit U4 are determined to be frozen also as it corresponds to the encoded bit V4 not to be transmitted. As such, the bits U0, U1, U2, U3, and U4 in the sequence of information bits 812 are frozen bits. The bits U5, U6, and U7 can be used to carry data bits.

More specifically, to determine X (as described supra, any bit of the sequence of information bits 812 with an index that is less than X is a frozen bit), the base station 802 may determines whether E is smaller than 3N/4. In certain configurations, when E is equal to or greater than 3N/4, the base station 802 determines that X is the smallest integer that is greater than or equal to (¾)N−E/2. When E is smaller than 3N/4, the base station 802 determines that X is the smallest integer that is greater than or equal to (9/16)N−E/4.

In certain configurations, when E is equal to or greater than 3N/4, the base station 802 determines that any bit of the sequence of information bits 812 with an index that is less than (N−E) is a frozen bit. When E is smaller than 3N/4, the base station 802 determines that any bit with an index that is less than (⅝)N−E/2 is a frozen bit. In certain configurations, when E is smaller than 3N/4, the base station 802 may instead determine that any bit of the sequence of information bits 812 with an index that is greater than or equal to N/2 and that is smaller than (⅞)N M/2 is a frozen bit.

Figure 10:
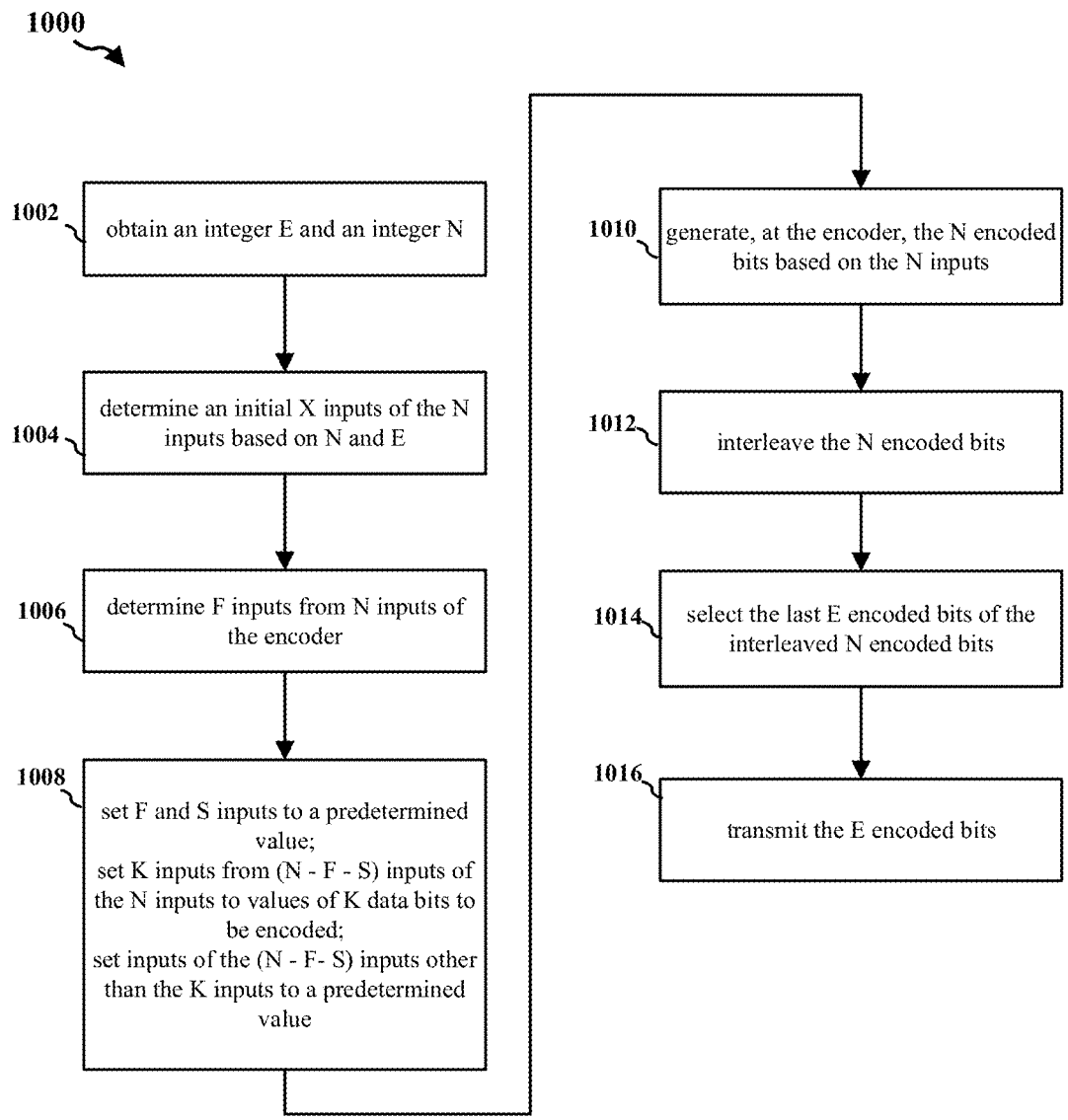
FIG. 10 is a flow chart of a method (process) for inputting bits to an encoder.

FIG. 10 is a flow chart 1000 of a method (process) for inputting bits to an encoder. The method may be performed by wireless equipment (e.g., the UE 804, the base station 802, the apparatus 1102, and the apparatus 1102').

At operation 1002, the wireless equipment obtains an integer E (e.g., 5) and an integer N (e.g., 8). E encoded bits (e.g., the encoded bits V2, V5, V3, V6, V7 in FIG. 8) are to be selected for transmission from N encoded bits (e.g., the encoded bits V0, V1, V4, V2, V5, V3, V6, V7 in FIG. 8) output from an encoder (e.g., the polar code encoder 870). In certain configurations, the encoder is a polar code encoder. At operation 1004, the wireless equipment determines an initial X (e.g., 4) inputs of N inputs (e.g., U0-U7) of the encoder based on N and E. At operation 1006, the wireless equipment determines F inputs (e.g., U2 and U3) from the N inputs (e.g., U0-U7). In particular, the F inputs are determined to be inputs of the X inputs (e.g., U0-U3) that are not within S inputs (e.g., U0, U1, U4) corresponding to S outputs (e.g., V0, V1, V4) of the encoder generating encoded bits not to be transmitted.

At operation 1008, the wireless equipment sets the F and S inputs to a predetermined value (e.g., 0). The wireless equipment also sets K inputs from (N−F−S) inputs (e.g., U5-U7) of the N inputs to values of K data bits to be encoded. The (N−F−S) inputs do not overlap with the F inputs or the S inputs. The wireless equipment sets inputs of the (N-F-S) inputs other than the K inputs to a predetermined value (e.g., 0).

At operation 1010, the wireless equipment generates, at the encoder, the N encoded bits based on the N inputs (e.g., V0-V7). At operation 1012, the wireless equipment interleaves the N encoded bits. At operation 1014, the wireless equipment selects the last E encoded bits of the interleaved N encoded bits. At operation 1016, the wireless equipment transmits the E encoded bits.

In certain configurations, X is determined to be the smallest integer that is greater than or equal to $(3/4)N-E/2$, when E is greater than or equal to $(3/4)N$. X is determined to be the smallest integer that is greater than or equal to $(9/16)N-E/4$, when E is less than $(3/4)N$.

Figure 11:
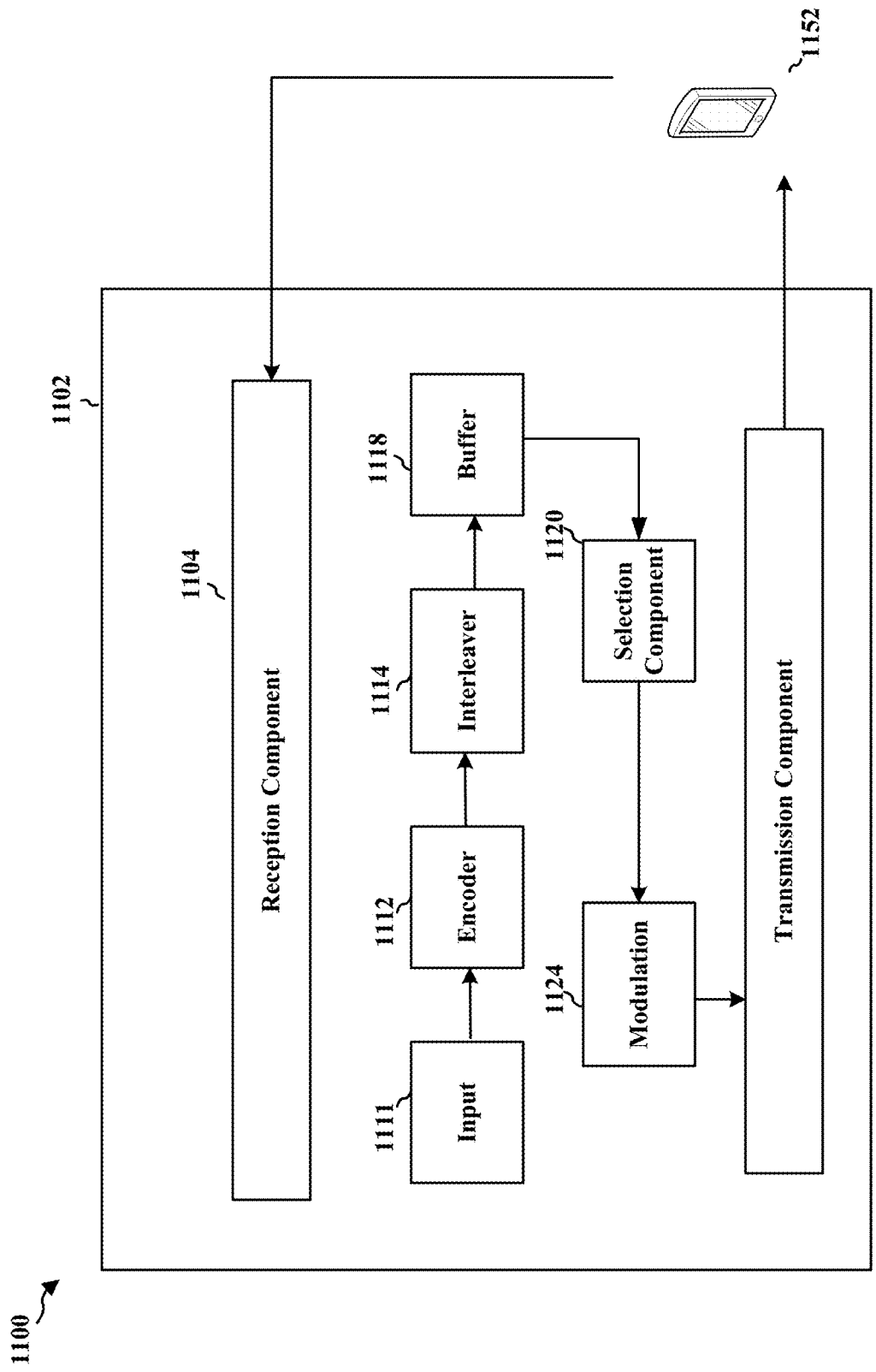
FIG. 11 is a conceptual data flow diagram illustrating the data flow between different components/means in an exemplary apparatus.

FIG. 11 is a conceptual data flow diagram 1100 illustrating the data flow between different components/means in an exemplary apparatus 1102. The apparatus 1102 may be a base station. The apparatus 1102 includes a reception component 1104, a transmission component 1110, an input component 1111, an encoder 1112, an interleaver 1114, a buffer 1118, a selection component 1120, and a modulation 1124.

The input component 1111 obtains an integer E and an integer N. E encoded bits are to be selected for transmission from N encoded bits output from an encoder. In certain configurations, the encoder 1112 is a polar code encoder. The input component 1111 determines an initial X inputs of the N inputs based on N and E.

In certain configurations, X is determined to be the smallest integer that is greater than or equal to $(3/4)N-E/2$, when E is greater than or equal to $(3/4)N$. X is determined to be the smallest integer that is greater than or equal to $(9/16)N-E/4$, when E is less than $(3/4)N$.

The input component 1111 determines F inputs from N inputs of the encoder. In particular, the F inputs are determined to be inputs of the X inputs that are not within S inputs corresponding to S outputs of the encoder generating encoded bits not to be transmitted.

The input component 1111 sets the F and S inputs to a predetermined value. The input component 1111 also sets K inputs from (N-F-S) inputs of the N inputs to values of K data bits to be encoded. The (N-F-S) inputs do not overlap with the F inputs or the S inputs. The input component 1111 sets inputs of the (N-F-S) inputs other than the K inputs to a predetermined value.

The encoder 1112 generates the N encoded bits based on the N inputs. The interleaver 1114 interleaves the N encoded bits, which are placed in the buffer 1118. The selection component 1120 selects from the buffer 1118 the last E encoded bits of the interleaved N encoded bits.

The modulation 1124 maps the E encoded bits to modulation bits carried by one or more symbols. The transmission component 1110 transmits the one or more symbols to a UE 1152.

Figure 12:
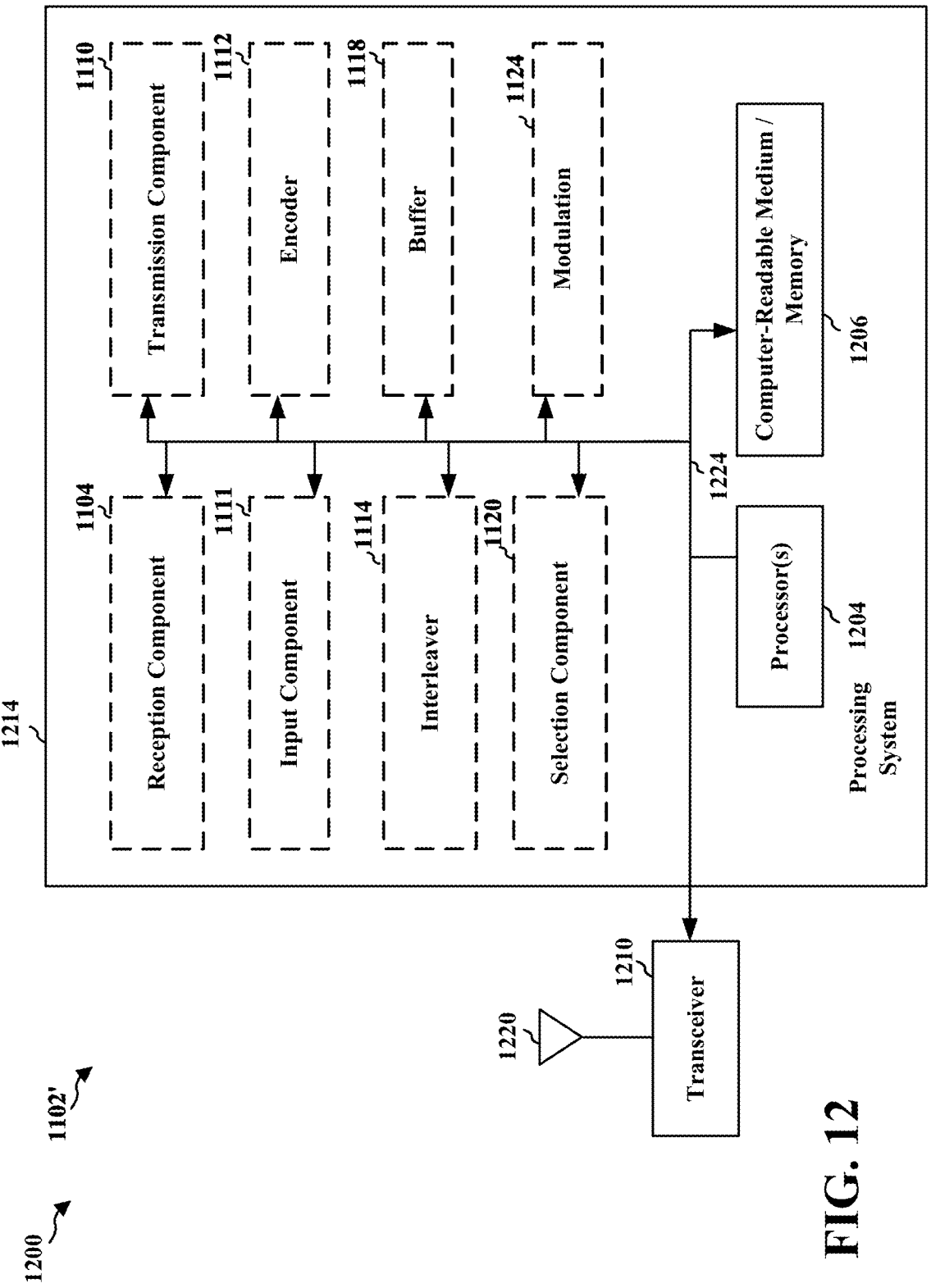
FIG. 12 is a diagram illustrating an example of a hardware implementation for an apparatus employing a processing system.

FIG. 12 is a diagram 1200 illustrating an example of a hardware implementation for an apparatus 1102' employing a processing system 1214. The apparatus 1102' may be a base station. The processing system 1214 may be implemented with a bus architecture, represented generally by a bus 1224. The bus 1224 may include any number of interconnecting buses and bridges depending on the specific application of the processing system 1214 and the overall design constraints. The bus 1224 links together various circuits including one or more processors and/or hardware components, represented by one or more processors 1204, the reception component 1104, the transmission component 1110, the input component 1111, the encoder 1112, the interleaver 1114, the buffer 1118, the selection component 1120, the modulation 1124, and a computer-readable medium/memory 1206. The bus 1224 may also link various other circuits such as timing sources, peripherals, voltage regulators, and power management circuits, etc.

The processing system 1214 may be coupled to a transceiver 1210, which may be one or more of the transceivers 354. The transceiver 1210 is coupled to one or more antennas 1220, which may be the communication antennas 320.

The transceiver 1210 provides a means for communicating with various other apparatus over a transmission medium. The transceiver 1210 receives a signal from the one or more antennas 1220, extracts information from the received signal, and provides the extracted information to the processing system 1214, specifically the reception component 1104. In addition, the transceiver 1210 receives information from the processing system 1214, specifically the transmission component 1110, and based on the received information, generates a signal to be applied to the one or more antennas 1220.

The processing system 1214 includes one or more processors 1204 coupled to a computer-readable medium/memory 1206. The one or more processors 1204 are responsible for general processing, including the execution of software stored on the computer-readable medium/memory 1206. The software, when executed by the one or more processors 1204, causes the processing system 1214 to perform the various functions described supra for any particular apparatus. The computer-readable medium/memory 1206 may also be used for storing data that is manipulated by the one or more processors 1204 when executing software. The processing system 1214 further includes at least one of a reception component 1104, a transmission component 1110, an input component 1111, an encoder 1112, an interleaver 1114, a buffer 1118, a selection component 1120, and a modulation 1124. The components may be software components running in the one or more processors 1204, resident/stored in the computer readable medium/memory 1206, one or more hardware components coupled to the one or more processors 1204, or some combination thereof.

The processing system 1214 may be a component of the base station 310 and may include the memory 376 and/or at least one of the TX processor 316, the RX processor 370, and the controller/processor 375.

In one configuration, the apparatus 1102/apparatus 1102' for wireless communication includes means for performing each of the operations of FIG. 10. The aforementioned means may be one or more of the aforementioned components of the apparatus 1102 and/or the processing system 1214 of the apparatus 1102' configured to perform the functions recited by the aforementioned means.

As described supra, the processing system 1214 may include the TX Processor 316, the RX Processor 370, and the controller/processor 375. As such, in one configuration, the aforementioned means may be the TX Processor 316, the RX Processor 370, and the controller/processor 375 configured to perform the functions recited by the aforementioned means.

It is understood that the specific order or hierarchy of blocks in the processes/flowcharts disclosed is an illustration of exemplary approaches. Based upon design preferences, it is understood that the specific order or hierarchy of blocks in the processes/flowcharts may be rearranged. Further, some blocks may be combined or omitted. The accompanying method claims present elements of the various blocks in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." The word "exemplary" is used herein to mean "serving as an example, instance, or illustration." Any aspect described herein as "exemplary" is not necessarily to be construed as preferred or advantageous over other aspects. Unless specifically stated otherwise, the term "some" refers to one or more. Combinations such as "at least one of A, B, or C," "one or more of A, B, or C," "at least one of A, B, and C," "one or more of A, B, and C," and "A, B, C, or any combination thereof" include any combination of A, B, and/or C, and may include multiples of A, multiples of B, or multiples of C. Specifically, combinations such as "at least one of A, B, or C," "one or more of A, B, or C," "at least one of A, B, and C," "one or more of A, B, and C," and "A, B, C, or any combination thereof" may be A only, B only, C only, A and B, A and C, B and C, or A and B and C, where any such combinations may contain one or more member or members of A, B, or C. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. The words "module," "mechanism," "element," "device," and the like may not be a substitute for the word "means." As such, no claim element is to be construed as a means plus function unless the element is expressly recited using the phrase "means for."

What is claimed is:

1. A method of wireless communication of a user equipment (UE), comprising:
obtaining an integer E and an integer N from an input component, wherein E encoded bits are to be selected for transmission from N encoded bits output from an encoder;
determining F inputs from N inputs of the encoder based on E and N, F being a positive integer, wherein the F inputs do not include S inputs that correspond to S outputs of the encoder generating encoded bits not to be transmitted, S being a positive integer;
setting each of the F inputs to a respective predetermined value;
generating, at the encoder, the N encoded bits according to the N inputs;
selecting the E encoded bits to be transmitted from the N encoded bits, wherein
F encoded bits of the N encoded bits generated according to the F inputs are a part of the E encoded bits; and
transmitting the E encoded bits to a base station.

2. The method of claim 1, further comprising: setting each of the S inputs to a respective predetermined value.

3. The method of claim 1, further comprising:
setting K inputs from (N-F-S) inputs of the N inputs of the encoder to values of K data bits to be encoded, wherein the (N-F-S) inputs do not overlap with the F inputs or the S inputs, (N-F-S) being equal to a result of subtracting F and S from N, K being a positive integer; and
setting each input of the (N-F-S) inputs other than the K inputs to a respective predetermined value.

4. The method of claim 1, further comprising:
generating, at the encoder, the N encoded bits based on the N inputs;
selecting the E encoded bits from the N encoded bits; and
transmitting the E encoded bits.

5. The method of claim 4, further comprising: prior to selecting the E encoded bits for transmission, interleaving the N encoded bits.

6. The method of claim 5, wherein the encoder is a polar code encoder, the method further comprising:
determining an initial X inputs of the N inputs based on N and E, X being a positive integer, wherein the determining F inputs from N inputs includes selecting the F inputs from the initial X inputs that are not within the S inputs.

7. The method of claim 6, further comprising: selecting the E encoded bits as E encoded bits at a back end of the interleaved N encoded bits.

8. The method of claim 6, wherein the X inputs correspond to indices from 0 to X−1 and the value of X is determined to be the smallest integer that is greater than or equal to $(3/4)N-E/2$, being greater than or equal to 0, when E is greater than or equal to $(3/4)N$.

9. The method of claim 6, wherein the X inputs correspond to indices from 0 to X−1 and the value of X is determined to be the smallest integer that is greater than or equal to $(9/16)N-E/4$, being greater than or equal to 0, when E is less than $(3/4)N$.

10. An apparatus for wireless communication, comprising:
a memory; and
at least one processor coupled to the memory and configured to:
obtain an integer E and an integer N, wherein E encoded bits are to be selected for transmission from N encoded bits output from an encoder;
determine F being a positive integer, wherein the F inputs do not include S inputs that correspond to S outputs of the encoder generating encoded bits not to be transmitted, S being a positive integer;
set each of the F inputs to a respective predetermined value;
generate, at the encoder, the N encoded bits according to the N inputs;
select the E encoded bits to be transmitted from the N encoded bits,
wherein F encoded bits of the N encoded bits generated according to the F inputs are a part of the E encoded bits; and
transmit the E encoded bits to a base station.

11. The apparatus of claim 10, wherein the at least one processor is further configured to: set each of the S inputs to a respective predetermined value.

12. The apparatus of claim 10, wherein the at least one processor is further configured to:
set K inputs from (N-F-S) inputs of the N inputs of the encoder to values of K data bits to be encoded, wherein the (N-F-S) inputs do not overlap with the F inputs or the S inputs, (N-F-S) being equal to a result of subtracting F and S from N, K being a positive integer; and
set each input of the (N-F-S) inputs other than the K inputs to a respective predetermined value.

13. The apparatus of claim 10, wherein the at least one processor is further configured to:
  generate, at the encoder, the N encoded bits based on the N inputs;
  select the E encoded bits from the N encoded bits; and
  transmit the E encoded bits.

14. The apparatus of claim 13, wherein the at least one processor is further configured to: prior to selecting the E encoded bits for transmission, interleave the N encoded bits.

15. The apparatus of claim 14, wherein the encoder is a polar code encoder, the at least one processor is further configured to:
  determine an initial X inputs of the N inputs based on N and E, X being a positive integer, wherein the determining F inputs from N inputs includes selecting the F inputs from the initial X inputs that are not within the S inputs.

16. The apparatus of claim 15, wherein the at least one processor is further configured to: select the E encoded bits as E encoded bits at a back end of the interleaved N encoded bits.

17. The apparatus of claim 15, wherein the X inputs correspond to indices from 0 to X−1 and the value of X is determined to be the smallest integer that is greater than or equal to $(3/4)N-E/2$, being greater than or equal to 0, when E is greater than or equal to $(3/4)N$.

18. The apparatus of claim 15, wherein the X inputs correspond to indices from 0 to X−1 and the value of X is determined to be the smallest integer that is greater than or equal to $(9/16)N-E/4$, being greater than or equal to 0, when E is less than $(3/4)N$.

19. A non-transitory computer-readable medium storing computer executable code for wireless communication of wireless equipment, comprising code to:
  obtain an integer E and an integer N, wherein E encoded bits are to be selected for transmission from N encoded bits output from an encoder;
  determine F being a positive integer, wherein the F inputs do not include S inputs that correspond to S outputs of the encoder generating encoded bits not to be transmitted, S being a positive integer;
  set each of the F inputs to a respective predetermined value;
  generate, at the encoder, the N encoded bits according to the N inputs;
  select the E encoded bits to be transmitted from the N encoded bits, wherein F encoded bits of the N encoded bits generated according to the F inputs are a part of the E encoded bits; and
  transmit the E encoded bits to a base station.

20. The non-transitory computer-readable medium of claim 19, wherein the code is further configured to: set each of the S inputs to a respective predetermined value.

* * * * *